(12) United States Patent
Choi et al.

(10) Patent No.: US 8,786,478 B1
(45) Date of Patent: Jul. 22, 2014

(54) CIRCUIT FOR IMPLEMENTING A CONTINUOUS-TIME DEGLITCHING TECHNIQUE FOR DIGITAL ANALOG CONVERTERS

(71) Applicant: NVIDIA Corporation, Santa Clara, CA (US)

(72) Inventors: Dong-Myung Choi, Cupertino, CA (US); Anuradha Subbaraman, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/754,806

(22) Filed: Jan. 30, 2013

(51) Int. Cl.
*H03M 1/66* (2006.01)
*H03M 1/10* (2006.01)

(52) U.S. Cl.
CPC *H03M 1/66* (2013.01); *H03M 1/10* (2013.01); *H03M 1/1033* (2013.01)
USPC .......................................... 341/144; 341/120

(58) Field of Classification Search
CPC ........ H03M 1/66; H03M 1/10; H03M 1/1033
USPC ................... 341/120, 118, 144; 330/259–261
See application file for complete search history.

(56) References Cited

U.S. PATENT DOCUMENTS

| 4,837,573 | A | * | 6/1989 | Brooks | 341/152 |
| 5,444,579 | A | * | 8/1995 | Klein et al. | 360/67 |
| 5,798,664 | A | * | 8/1998 | Nagahori et al. | 327/307 |
| 6,683,484 | B1 | * | 1/2004 | Kueng et al. | 327/307 |
| 6,710,645 | B2 | * | 3/2004 | Isken et al. | 330/9 |
| 8,264,268 | B2 | * | 9/2012 | Cho et al. | 327/307 |
| 2004/0252037 | A1 | * | 12/2004 | Itoh | 341/118 |

OTHER PUBLICATIONS

Maxim Integrated Products, "Octal, 13-Bit Voltage-Output DAC with Parallel Interface," MAX5839, 2000, pp. 1-16.
Maxim Integrated, "Deglitching Techniques for High-Voltage R-2R DACs," Application Note 583, AN583, May 1, 2001, pp. 1-7.

\* cited by examiner

*Primary Examiner* — Brian Young
(74) *Attorney, Agent, or Firm* — Zilka-Kotab, PC

(57) ABSTRACT

A processor and a circuit implementing a continuous-time deglitching technique for a digital-to-analog converter are disclosed. The circuit includes a digital-to-analog converter having a differential current output, an operational amplifier having an inverting input coupled to a first output of the differential current output and a non-inverting input coupled to a second output of the differential current output, and a transistor coupled to the second output and the output of the operational amplifier. The operational amplifier is configured to operate the transistor to adjust the voltage potential of the second output to substantially match the voltage potential of the first output.

20 Claims, 8 Drawing Sheets

US 8,786,478 B1

CIRCUIT FOR IMPLEMENTING A CONTINUOUS-TIME DEGLITCHING TECHNIQUE FOR DIGITAL ANALOG CONVERTERS

FIELD OF THE INVENTION

The present invention relates to digital-to-analog converters (DACs), and more particularly to deglitching techniques for smoothing DAC output.

BACKGROUND

When a given DAC is updated to a new digital input code, the output of the DAC changes to try and generate the new analog signal. The internal components of the DAC include a plurality of switches (i.e., field effect transistors). The effects of switching digital circuits within the DAC to change the analog output signal may cause glitches to occur. Glitches may appear at the DAC output as spikes in voltage. Glitches may be caused by two different mechanisms. First, glitches can arise due to capacitive coupling of components within the DAC circuit during transitions of the digital elements. Second, glitches can arise due to asynchronous operation of the components (e.g., some FETS may turn off slower than the FETs turn on due to mismatches in the rise time and fall time of the FETS and/or routing of signals to the FETs). Deglitching techniques have been implemented in some analog circuits to alleviate the effects of glitching. One common technique is to implement a sample and hold circuit coupled to the output of the DAC.

FIG. 1 illustrates a deglitching circuit 100 that implements a sample and hold technique, in accordance with the prior art. The circuit 100 includes an N-bit latch 110, an N-bit DAC 120, a switch 130 (e.g., a Field Effect Transistor or FET), an operational amplifier (Op Amp) 140, and a capacitor 150. The latch 110 receives an N-bit digital input signal and a LD signal. The LD signal is used to latch the N-bit digital input signal to prevent unexpected transitions of the DAC 120. When the LD signal transitions from low to high, a SW signal that controls the switch 130 transitions from high to low, thereby initializing the transition of the DAC output ($V_{DAC}$). While the LD signal is high, the input to the latch 110 is passed through to the output of the latch 110. The switch 130 isolates the DAC output from the Op Amp 140 when the SW signal is low, thereby preventing any glitches from affecting the analog output signal ($V_{OUT}$). After a short interval, the LD signal transitions from high to low, latching the N-bit input signal at the input to the DAC 120, but the SW signal remains low. When the switch 130 is open, the capacitor 150 stores the DAC output voltage from the previous sample time such that $V_{OUT}$ remains approximately constant (minus leakage current through the switch 130 and the Op Amp 140) while the DAC 120 transitions to the new output voltage. The DAC output is allowed to settle for a settling time, and then the SW signal transitions from low to high thereby connecting $V_{DAC}$ to the capacitor 150 and the input of the Op Amp 140. The analog output, $V_{OUT}$, transitions from the old value to the new value and the capacitor 150 drains or stores energy to match the DAC output, $V_{DAC}$.

However, the conventional sample and hold technique shown in FIG. 1 has some associated issues. First, the switch 130 must be driven by a voltage level much higher than the analog signal in order to ensure proper operation of the switch 130. Second, a charge-injection due to the operation of the switch 130 is still present (i.e., capacitive discharge of the transistor may still cause glitches at the input of the Op Amp 140. Third, the Op Amp 140 may introduce noise at the output of the Op Amp 140. Thus, there is a need for addressing this issue and/or other issues associated with the prior art.

SUMMARY

A processor and a circuit implementing a continuous-time deglitching technique for a digital-to-analog converter are disclosed. The circuit includes a digital-to-analog converter having a differential current output, an operational amplifier having an inverting input coupled to a first output of the differential current output and a non-inverting input coupled to a second output of the differential current output, and a transistor coupled to the second output and the output of the operational amplifier. The operational amplifier is configured to operate the transistor to adjust the voltage potential of the second output to substantially match the voltage potential of the first output.

DETAILED DESCRIPTION

The object of the continuous-time deglitching technique described below is to ensure minimal voltage difference or, ideally, no voltage difference on the switching node when the unit cell is switched on and off by suppressing charge sharing between the parasitic capacitors associated with the switched current source and the DAC output.

Figure 2:
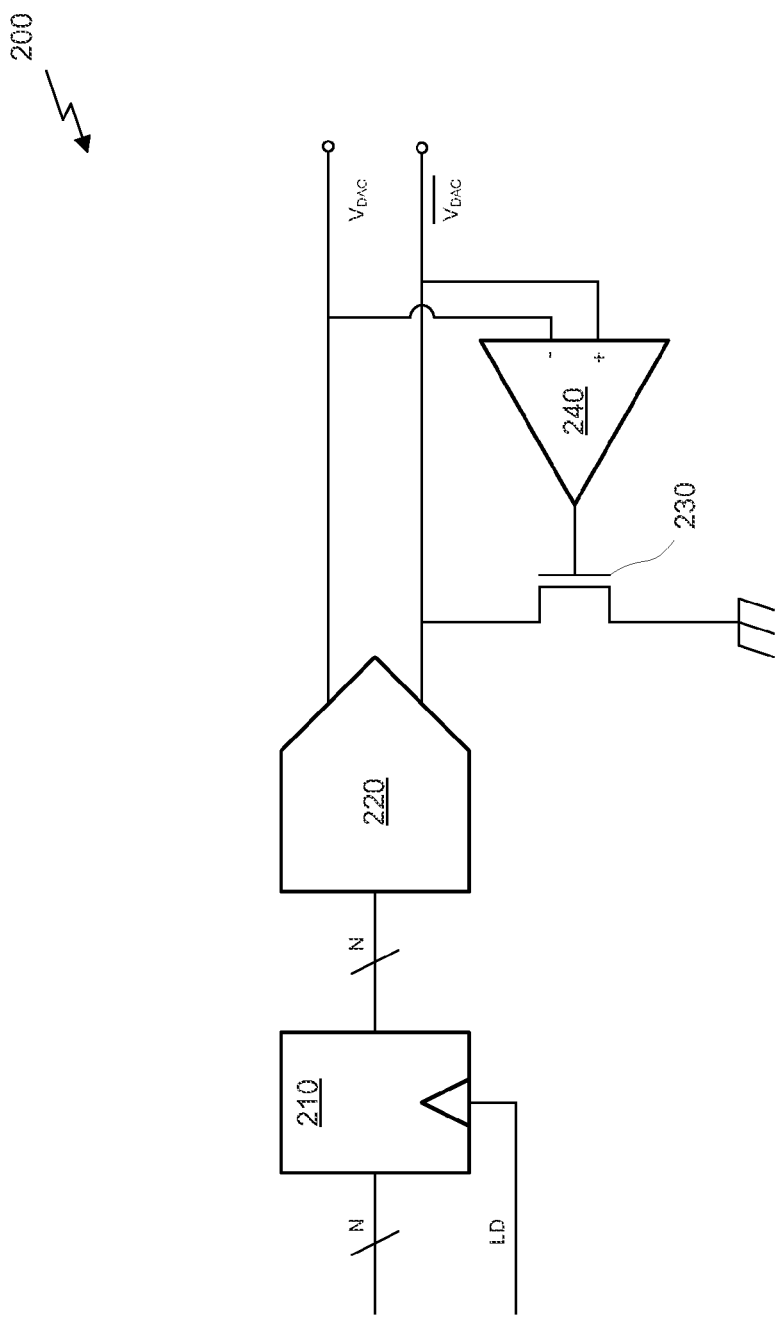
FIG. 2 illustrates a deglitching circuit coupled to the output of a DAC, in accordance with one embodiment.

FIG. 2 illustrates a deglitching circuit 200 coupled to the output of a DAC 220, in accordance with one embodiment. As shown in FIG. 2, the circuit 200 includes an N-bit latch 210, an N-bit DAC 220, and an operational amplifier (Op Amp) 240. The latch 210 receives an N-bit digital input signal and a LD signal. The LD signal is used to latch the N-bit digital input signal to prevent unexpected transitions of the DAC 220. When the LD signal transitions from low to high, the N-bit digital input signal is passed through to the DAC 220 while the LD signal is high. When the LD signal transitions from high to low, the previous N-bit digital input signal is maintained by the latch 210 as the input to the DAC 220.

In one embodiment, the DAC 220 is an N-bit, current-steering DAC with differential output. One side of the differential output, the non-inverting DAC output (i.e., $V_{DAC}$), is associated with a non-inverting current output (i.e., $I_{DAC}$) generated based on the N-bit digital input signal. The other side of the differential output, the inverting DAC output (i.e., $\overline{V_{DAC}}$), is associated with an inverting current output (i.e., $\overline{I_{DAC}}$) generated based on an inverted version of the N-bit digital input signal. The inverted version of the N-bit digital input signal is an N-bit value where each bit of the inverted version of the N-bit digital input signal is set by inverting a corresponding bit of the N-bit digital input signal. In other words, the sum of the non-inverting current output and the inverting current output of the DAC 220 is constant for every N-bit digital input signal. It will be appreciated that voltage potential at the non-inverting DAC output (i.e., $V_{DAC}$) and the inverting DAC output (i.e., $\overline{V_{DAC}}$) are based on the load coupled to the DAC output based on the current output by the DAC 220. In one embodiment, DAC 220 may be a 10-bit current steering DAC with differential output.

The continuous-time deglitching technique comprises coupling the non-inverting DAC output (i.e., $V_{DAC}$) to the inverting input (−) of Op Amp 240 and coupling the inverting DAC output (i.e., $\overline{V_{DAC}}$) to the non-inverting input (+) of Op Amp 240. The output of the Op Amp 240 is coupled to the gate of an NMOS transistor 230. The drain of the NMOS transistor 230 is coupled to the inverting DAC output (i.e., $\overline{V_{DAC}}$) and the source of the NMOS transistor 230 is coupled to GND. In operation, the Op Amp 240 and the NMOS transistor 230 cause the voltage potential on the inverting DAC output to track the voltage potential on the non-inverting DAC output. In an alternative embodiment, the continuous-time deglitching technique comprises coupling the non-inverting DAC output (i.e., $V_{DAC}$) to the non-inverting input (+) of Op Amp 240 and coupling the inverting DAC output (i.e., $\overline{V_{DAC}}$) to the inverting input (−) of Op Amp 240. It will be appreciated that in either embodiment, the Op Amp 240 is implemented as a comparator between the voltage potential of the non-inverting DAC output and the inverting DAC output.

Figure 1:
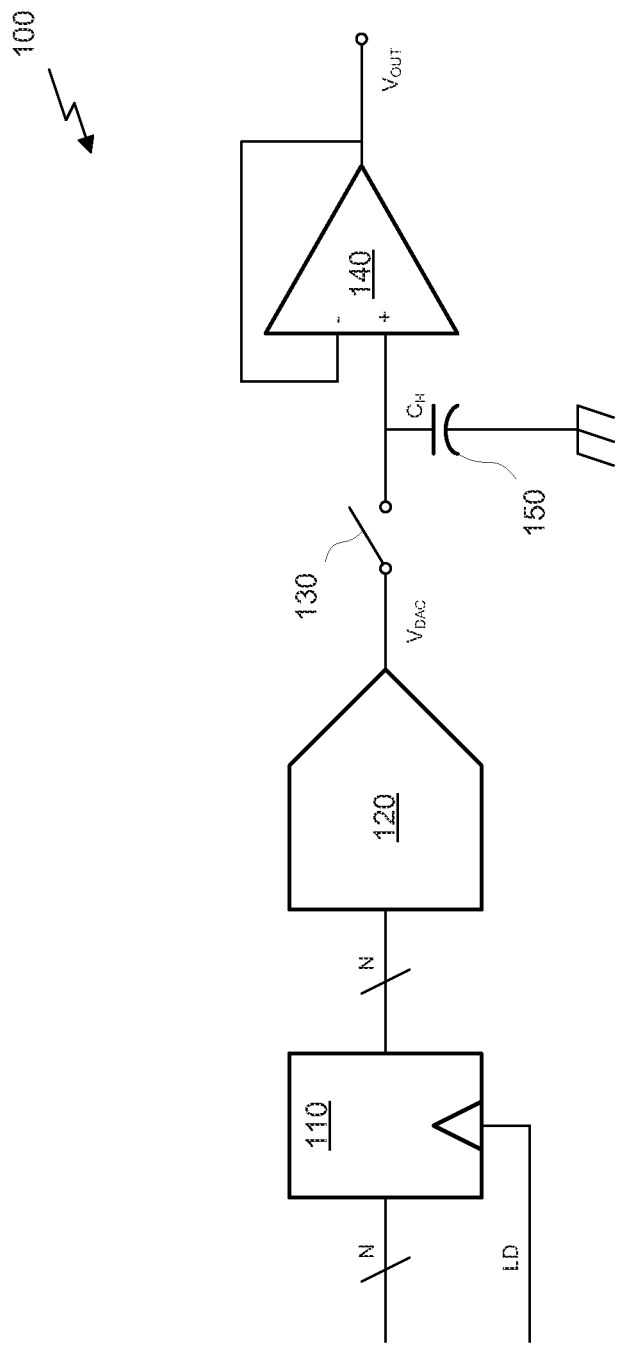
FIG. 1 illustrates a deglitching circuit that implements a sample and hold technique, in accordance with the prior art.

Unlike the sample and hold technique illustrated in FIG. 1, the continuous-time deglitching technique implemented in the circuit 200 doesn't include a switch (i.e., FET 130) between the output of the DAC 220 and the analog output signal. Removing switch 130 alleviates issues caused by capacitive discharge of the switch 130 in the conventional sample and hold technique. In addition, the noise of the Op Amp 240 does not contribute to the output signal in the deglitching technique because the output signals are only connected to the high impedance inputs of the Op Amp 240, not driven by the output of the amplifier such as with the sample and hold technique employed by the circuit shown in FIG. 1.

Figure 3A:
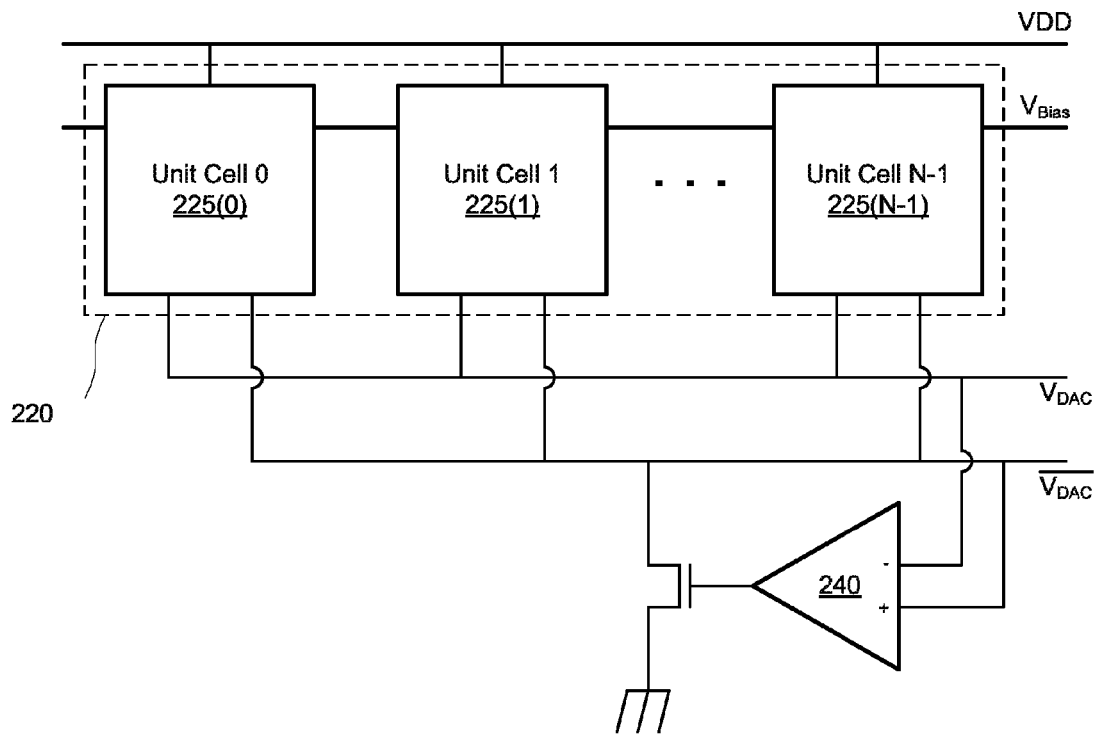
FIG. 3A illustrates the DAC of the deglitching circuit, in accordance with one embodiment.

FIG. 3A illustrates the DAC 220 of the deglitching circuit 200, in accordance with one embodiment. As shown in FIG. 3A, the DAC 220 includes a plurality of unit cells 225. In one embodiment, the number of unit cells 225 is equal to the number of bits of precision of the DAC 220. For example, if the digital input signal includes ten bits then the DAC 220 includes ten binary-weighted unit cells 225, if no segmentation is used. In alternative embodiments, the number of unit cells 225 may be different than the number of bits of precision of the DAC 220. For example, the DAC 220 may be thermometer-coded, which includes a number of unit cells 225 equal to the number of distinct output values of the DAC 220. The DAC 220 may also implement a hybrid architecture, which uses a binary-weighted unit cells 225 for the least-significant bits of the digital input (e.g., the 4 LSBs) and thermometer coded unit cells 225 for the most-significant bits of the digital input (e.g., the 6 MSBs). In the 6/4 architecture of a 10-bit DAC, the 6 MSBs would be associated with 63 thermometer coded unit cells 225 and the 4 LSBs would be associated with 16 binary-weighted unit cells 225. Each unit cell 225 receives a supply voltage VDD and a bias voltage $V_{Bias}$. The reference voltage is used to generate current sources internal to each unit cell 225 of the DAC 220, and the bias voltage is used to bias the current sources of the unit cells 225.

The DAC 220 outputs a current, $I_{DAC}$, proportional to the N-bit digital input on the non-inverting DAC output. The voltage potential on the non-inverting DAC output, $V_{DAC}$, that results is based on the impedance of the load coupled to the non-inverting DAC output. Similarly, the DAC 220 outputs a current, $\overline{I_{DAC}}$, proportional to the inverted version of the N-bit digital input on the inverting DAC output. The voltage potential on the inverting DAC output, $V_{DAC}$, that would result, if not for Op Amp 240 and NMOS transistor 230, is based on the impedance of the load coupled to the inverting DAC output. Thus, without Op Amp 240 and NMOS transistor 230, the voltage potential of the differential DAC outputs is dependent on the loads coupled to the differential outputs and would likely be very different, causing transient voltages to appear on the DAC outputs when switching between different N-bit digital input signals. The Op Amp 240 and the NMOS transistor 230 causes the voltage potential of the inverting DAC output to track the voltage potential of the non-inverting DAC output.

Figure 3B:
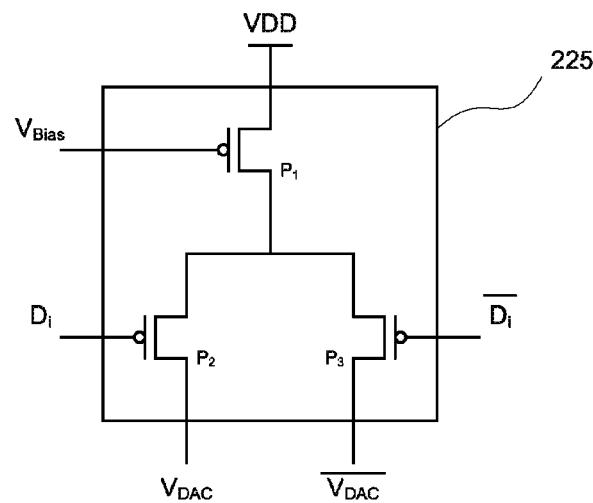
FIG. 3B illustrates a unit cell of the DAC, in accordance with one embodiment.

FIG. 3B illustrates a unit cell 225 of the DAC 220, in accordance with one embodiment. It will be appreciated that the schematic of unit cell 225 is simplified and that unit cell 225 may include, but is not limited to, additional circuit components such as decoder logic, switch drivers, a biasing circuit, and a current source. As shown in FIG. 3B, the bias voltage, $V_{Bias}$, is coupled, either directly or indirectly, to the gate of a first PMOS transistor, $P_1$, and the supply voltage, VDD, is coupled, either directly or indirectly, to the source of the first PMOS transistor. The drain of the first PMOS transistor is coupled, either directly or indirectly, to the source of a second PMOS transistor, $P_2$, and the source of a third PMOS transistor, $P_3$. The gate of the second PMOS transistor is coupled, either directly or indirectly, to an input signal, $D_i$. The gate of the third PMOS transistor is coupled, either directly or indirectly, to an inverted input signal, $\overline{D_i}$. The drain of the second PMOS transistor is coupled to the non-inverting DAC output, $V_{DAC}$, and the drain of the third PMOS transistor is coupled to the inverting DAC output, $\overline{V_{DAC}}$.

As used herein, the transistors are coupled directly to a signal if the signal is coupled to the transistor without any intervening logic, and the transistors are coupled indirectly to a signal if the signal is coupled to the transistor with intervening logic. Intervening logic may be any type of discrete logic or electrical components such as resistors or capacitors. For example, the first PMOS transistor may be connected to the supply voltage indirectly through additional circuit elements that comprise a current source. In another example, the first PMOS transistor may be connected to the supply voltage indirectly as a component of a current source sub-circuit that is coupled to both the supply voltage and the bias voltage. Similarly, the bias voltage may be buffered using an op amp (not shown) within each unit cell 225 before being connected to the gate of the first PMOS transistor.

Figure 3C:
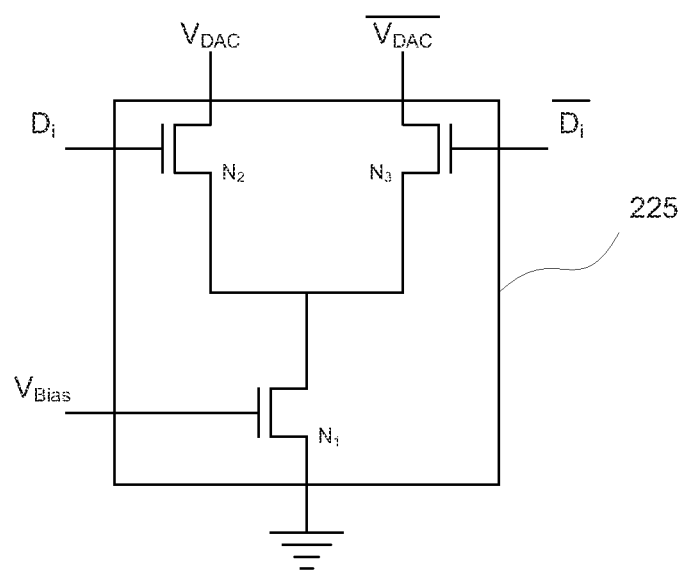
FIG. 3C illustrates a unit cell of the DAC, in accordance with another embodiment.

FIG. 3C illustrates a unit cell 225 of the DAC 220, in accordance with another embodiment. As shown in FIG. 3C, the bias voltage, $V_{Bias}$, is coupled, either directly or indirectly, to the gate of a first NMOS transistor, $N_1$, and a ground voltage, GND, is coupled, either directly or indirectly, to the source of the first NMOS transistor. The drain of the first NMOS transistor is coupled, either directly or indirectly, to the source of a second NMOS transistor, $N_2$, and the source of a third NMOS transistor, $N_3$. The gate of the second NMOS transistor is coupled, either directly or indirectly, to an input bit, $D_i$. The gate of the third NMOS transistor is coupled, either directly or indirectly, to an inverted input bit, $\overline{D_i}$. The drain of the second NMOS transistor is coupled to the non-inverting DAC output, $V_{DAC}$, and the drain of the third NMOS transistor is coupled to the inverting DAC output, $\overline{V_{DAC}}$.

DAC 220 is described above for illustrative purposes only. It will be appreciated that other configurations of DAC 220 are contemplated as within the scope of the present disclosure. As long as the DAC includes a non-inverting output and an inverting output, then the continuous-time deglitching technique described above may be implemented to alleviate glitch energy in the non-inverting output of the DAC.

It should be noted that, while various optional features are set forth herein in connection with the continuous-time deglitching technique, such features are for illustrative purposes only and should not be construed as limiting in any manner. In one embodiment, the circuit 200 described above may be implemented in one or more units of a parallel processing unit.

Figure 4:
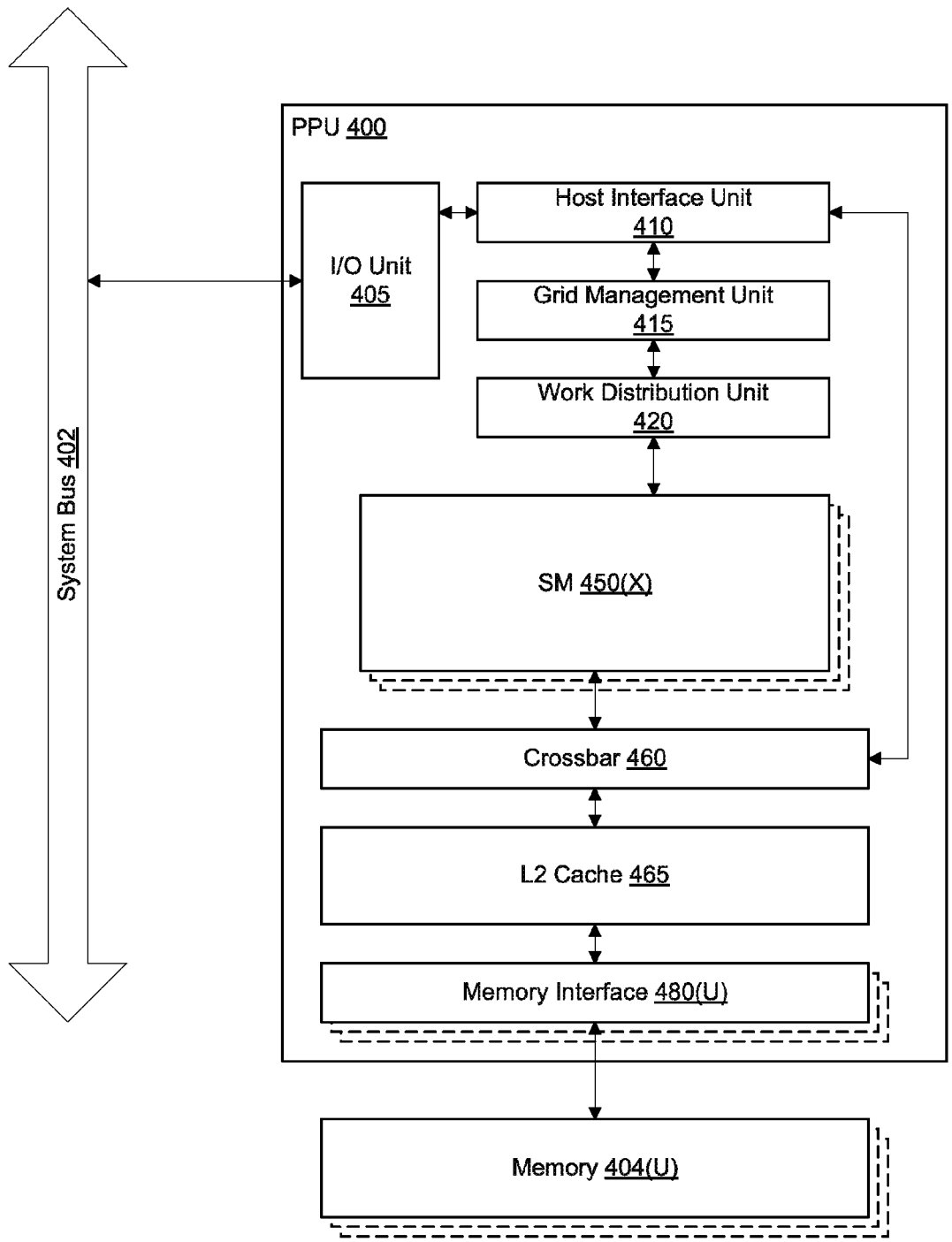
FIG. 4 illustrates a parallel processing unit (PPU), according to one embodiment.

FIG. 4 illustrates a parallel processing unit (PPU) 400, according to one embodiment. While a parallel processor is provided herein as an example of the PPU 400, it should be strongly noted that such processor is set forth for illustrative purposes only, and any processor may be employed to supplement and/or substitute for the same. In one embodiment, the PPU 400 is configured to execute a plurality of threads concurrently in two or more streaming multi-processors (SMs) 450. A thread (i.e., a thread of execution) is an instantiation of a set of instructions executing within a particular SM 450. Each SM 450, described below in more detail in conjunction with FIG. 5, may include, but is not limited to, one or more processing cores, one or more load/store units (LSUs), a level-one (L1) cache, shared memory, and the like.

In one embodiment, the PPU 400 includes an input/output (I/O) unit 405 configured to transmit and receive communications (i.e., commands, data, etc.) from a central processing unit (CPU) (not shown) over the system bus 402. The I/O unit 405 may implement a Peripheral Component Interconnect Express (PCIe) interface for communications over a PCIe bus. In alternative embodiments, the I/O unit 405 may implement other types of well-known bus interfaces.

The PPU 400 also includes a host interface unit 410 that decodes the commands and transmits the commands to the grid management unit 415 or other units of the PPU 400 (e.g., memory interface 480) as the commands may specify. The host interface unit 410 is configured to route communications between and among the various logical units of the PPU 400.

In one embodiment, a program encoded as a command stream is written to a buffer by the CPU. The buffer is a region in memory, e.g., memory 404 or system memory, that is accessible (i.e., read/write) by both the CPU and the PPU 400. The CPU writes the command stream to the buffer and then transmits a pointer to the start of the command stream to the PPU 400. The host interface unit 410 provides the grid management unit (GMU) 415 with pointers to one or more streams. The GMU 415 selects one or more streams and is configured to organize the selected streams as a pool of pending grids. The pool of pending grids may include new grids that have not yet been selected for execution and grids that have been partially executed and have been suspended.

A work distribution unit 420 that is coupled between the GMU 415 and the SMs 450 manages a pool of active grids, selecting and dispatching active grids for execution by the SMs 450. Pending grids are transferred to the active grid pool by the GMU 415 when a pending grid is eligible to execute, i.e., has no unresolved data dependencies. An active grid is transferred to the pending pool when execution of the active grid is blocked by a dependency. When execution of a grid is completed, the grid is removed from the active grid pool by the work distribution unit 420. In addition to receiving grids from the host interface unit 410 and the work distribution unit 420, the GMU 410 also receives grids that are dynamically generated by the SMs 450 during execution of a grid. These dynamically generated grids join the other pending grids in the pending grid pool.

In one embodiment, the CPU executes a driver kernel that implements an application programming interface (API) that enables one or more applications executing on the CPU to schedule operations for execution on the PPU 400. An application may include instructions (i.e., API calls) that cause the driver kernel to generate one or more grids for execution. In one embodiment, the PPU 400 implements a SIMD (Single-Instruction, Multiple-Data) architecture where each thread block (i.e., warp) in a grid is concurrently executed on a different data set by different threads in the thread block. The driver kernel defines thread blocks that are comprised of k related threads, such that threads in the same thread block may exchange data through shared memory. In one embodiment, a thread block comprises 32 related threads and a grid is an array of one or more thread blocks that execute the same stream and the different thread blocks may exchange data through global memory.

In one embodiment, the PPU 400 comprises X SMs 450 (X). For example, the PPU 400 may include 15 distinct SMs 450. Each SM 450 is multi-threaded and configured to execute a plurality of threads (e.g., 32 threads) from a particular thread block concurrently. Each of the SMs 450 is connected to a level-two (L2) cache 465 via a crossbar 460 (or other type of interconnect network). The L2 cache 465 is connected to one or more memory interfaces 480. Memory interfaces 480 implement 16, 32, 64, 128-bit data buses, or the like, for high-speed data transfer. In one embodiment, the PPU 400 comprises U memory interfaces 480(U), where each memory interface 480(U) is connected to a corresponding memory device 404(U). For example, PPU 400 may be connected to up to 6 memory devices 404, such as graphics double-data-rate, version 5, synchronous dynamic random access memory (GDDR5 SDRAM).

In one embodiment, the PPU 400 implements a multi-level memory hierarchy. The memory 404 is located off-chip in SDRAM coupled to the PPU 400. Data from the memory 404 may be fetched and stored in the L2 cache 465, which is located on-chip and is shared between the various SMs 450. In one embodiment, each of the SMs 450 also implements an L1 cache. The L1 cache is private memory that is dedicated to a particular SM 450. Each of the L1 caches is coupled to the shared L2 cache 465. Data from the L2 cache 465 may be fetched and stored in each of the L1 caches for processing in the functional units of the SMs 450.

In one embodiment, the PPU 400 comprises a graphics processing unit (GPU). The PPU 400 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 400 can be configured to process the graphics primitives to generate a frame buffer (i.e., pixel data for each of the pixels of the display). The driver kernel implements a graphics processing pipeline, such as the graphics processing pipeline defined by the OpenGL API.

An application writes model data for a scene (i.e., a collection of vertices and attributes) to memory. The model data defines each of the objects that may be visible on a display. The application then makes an API call to the driver kernel that requests the model data to be rendered and displayed. The driver kernel reads the model data and writes commands to the buffer to perform one or more operations to process the model data. The commands may encode different shader programs including one or more of a vertex shader, hull shader, geometry shader, pixel shader, etc. For example, the GMU 415 may configure one or more SMs 450 to execute a vertex shader program that processes a number of vertices defined by the model data. In one embodiment, the GMU 415 may configure different SMs 450 to execute different shader programs concurrently. For example, a first subset of SMs 450 may be configured to execute a vertex shader program while a second subset of SMs 450 may be configured to execute a pixel shader program. The first subset of SMs 450 processes vertex data to produce processed vertex data and writes the processed vertex data to the L2 cache 465 and/or the memory 404. After the processed vertex data is rasterized (i.e., transformed from three-dimensional data into two-dimensional data in screen space) to produce fragment data, the second subset of SMs 450 executes a pixel shader to produce processed fragment data, which is then blended with other processed fragment data and written to the frame buffer in memory 404. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The PPU 400 may be included in a desktop computer, a laptop computer, a tablet computer, a smart-phone (e.g., a wireless, hand-held device), personal digital assistant (PDA), a digital camera, a hand-held electronic device, and the like. In one embodiment, the PPU 400 is embodied on a single semiconductor substrate. In another embodiment, the PPU 400 is included in a system-on-a-chip (SoC) along with one or more other logic units such as a reduced instruction set computer (RISC) CPU, a memory management unit (MMU), a digital-to-analog converter (DAC), and the like.

In one embodiment, the PPU 400 may be included on a graphics card that includes one or more memory devices 404 such as GDDR5 SDRAM. The graphics card may be configured to interface with a PCIe slot on a motherboard of a desktop computer that includes, e.g., a northbridge chipset and a southbridge chipset. In yet another embodiment, the PPU 400 may be an integrated graphics processing unit (iGPU) included in the chipset (i.e., Northbridge) of the motherboard.

Figure 5:
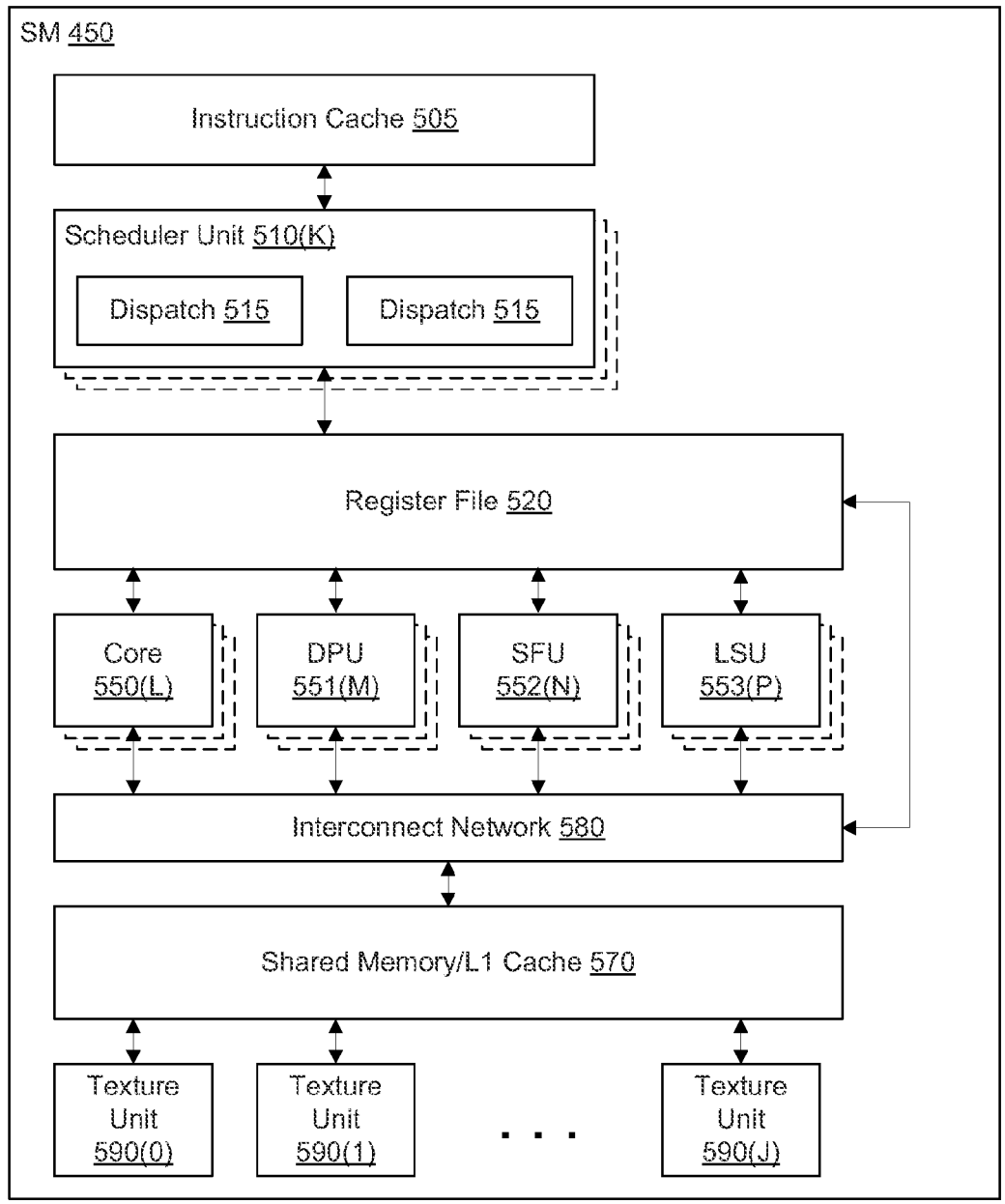
FIG. 5 illustrates the streaming multi-processor of FIG. 4, according to one embodiment.

FIG. 5 illustrates the streaming multi-processor 450 of FIG. 4, according to one embodiment. As shown in FIG. 5, the SM 450 includes an instruction cache 505, one or more scheduler units 510, a register file 520, one or more processing cores 550, one or more double precision units (DPUs) 551, one or more special function units (SFUs) 552, one or more load/store units (LSUs) 553, an interconnect network 580, a shared memory/L1 cache 570, and one or more texture units 590.

As described above, the work distribution unit 420 dispatches active grids for execution on one or more SMs 450 of the PPU 400. The scheduler unit 510 receives the grids from the work distribution unit 420 and manages instruction scheduling for one or more thread blocks of each active grid. The scheduler unit 510 schedules threads for execution in groups of parallel threads, where each group is called a warp. In one embodiment, each warp includes 32 threads. The scheduler unit 510 may manage a plurality of different thread blocks, allocating the thread blocks to warps for execution and then scheduling instructions from the plurality of different warps on the various functional units (i.e., cores 550, DPUs 551, SFUs 552, and LSUs 553) during each clock cycle.

In one embodiment, each scheduler unit 510 includes one or more instruction dispatch units 515. Each dispatch unit 515 is configured to transmit instructions to one or more of the functional units. In the embodiment shown in FIG. 5, the scheduler unit 510 includes two dispatch units 515 that enable two different instructions from the same warp to be dispatched during each clock cycle. In alternative embodiments, each scheduler unit 510 may include a single dispatch unit 515 or additional dispatch units 515.

Each SM 450 includes a register file 520 that provides a set of registers for the functional units of the SM 450. In one embodiment, the register file 520 is divided between each of the functional units such that each functional unit is allocated a dedicated portion of the register file 520. In another embodiment, the register file 520 is divided between the different warps being executed by the SM 450. The register file 520 provides temporary storage for operands connected to the data paths of the functional units.

Each SM 450 comprises L processing cores 550. In one embodiment, the SM 450 includes a large number (e.g., 192, etc.) of distinct processing cores 550. Each core 550 is a fully-pipelined, single-precision processing unit that includes a floating point arithmetic logic unit and an integer arithmetic logic unit. In one embodiment, the floating point arithmetic logic units implement the IEEE 754-2008 standard for floating point arithmetic. Each SM 450 also comprises M DPUs 551 that implement double-precision floating point arithmetic, N SFUs 552 that perform special functions (e.g., copy rectangle, pixel blending operations, and the like), and P LSUs 553 that implement load and store operations between the shared memory/L1 cache 570 and the register file 520. In one embodiment, the SM 450 includes 64 DPUs 551, 32 SFUs 552, and 32 LSUs 553.

Each SM 450 includes an interconnect network 580 that connects each of the functional units to the register file 520 and the shared memory/L1 cache 570. In one embodiment, the interconnect network 580 is a crossbar that can be configured to connect any of the functional units to any of the registers in the register file 520 or the memory locations in shared memory/L1 cache 570.

In one embodiment, the SM 450 is implemented within a GPU. In such an embodiment, the SM 450 comprises J texture units 590. The texture units 590 are configured to load texture maps (i.e., a 2D array of texels) from the memory 404 and sample the texture maps to produce sampled texture values for use in shader programs. The texture units 590 implement texture operations such as anti-aliasing operations using mipmaps (i.e., texture maps of varying levels of detail). In one embodiment, the SM 450 includes 16 texture units 590.

The PPU 400 described above may be configured to perform highly parallel computations much faster than conventional CPUs. Parallel computing has advantages in graphics processing, data compression, biometrics, stream processing algorithms, and the like.

Figure 6:
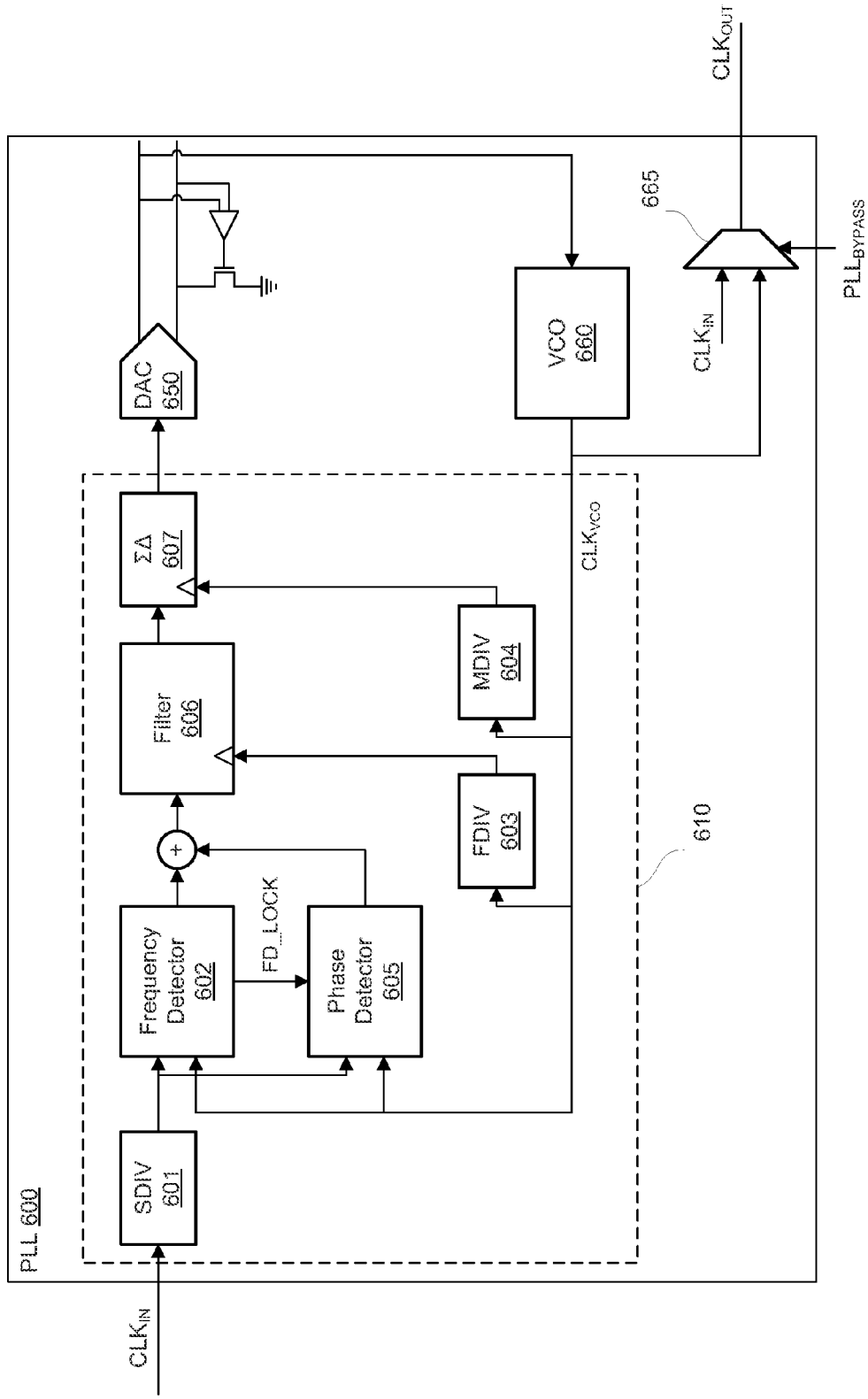
FIG. 6 illustrates a PLL implemented in the PPU of FIG. 4, in accordance with one embodiment.

In one embodiment, the continuous-time deglitching technique is implemented in a digital phase-locked loop (PLL) in the PPU 400. FIG. 6 illustrates a PLL 600 implemented in PPU 400, in accordance with one embodiment. The PLL 600 includes digital logic 610 that receives a clock input signal ($CLK_{IN}$). The digital logic 610 tracks the phase of a divided clock signal and generates a digital input code for the DAC

650. In one embodiment, the digital logic includes a plurality of dividers (i.e., SDIV 601, FDIV 603, and MDIV 604) for generating a clock output signal ($CLK_{OUT}$) that is locked in phase with the clock input signal and may be a different frequency (based on the configuration of the dividers) of the clock input signal. The digital input code generated by the digital logic 610 causes DAC 650 to output a differential output signal (analog current) that is coupled to a voltage controlled oscillator (VCO) 660. Again, although not shown explicitly, the differential output signal may be converted from a current level to a voltage level before being transmitted to the VCO 660. The VCO 660 generates a clock output signal that is routed to a feedback loop in the digital logic block 610. In one embodiment, the PLL 600 includes PLL bypass logic 665 such as a multiplexor that enables the clock input signal to be passed through to the clock output signal.

The digital logic 610 receives the clock input signal at a first divider unit (SDIV) 601. The first divider unit 601 may divide the clock by a certain integer (e.g., 1, 2, or 4) to generate a reference clock signal having a frequency that is a fraction of the input clock signal frequency. The reference clock signal is passed to a frequency detector 602 and a phase detector 605. The frequency detector 602 and the phase detector 605 also receive the VCO clock output ($CLK_{VCO}$) within the feedback loop. The VCO clock output is fed to an N-bit counter inside the frequency detector 602 and the output of the counter is updated at the rising edge of the reference clock. At the same time, the counter value is evaluated and compared with a pre-defined value, such that the pre-defined value and the value of the counter should be equal in a frequency lock state. The phase detector 605 detects any phase difference between the VCO clock output and the reference clock signal. Any difference in either frequency or phase that is detected between the VCO clock output and the reference clock signal is summed to produce an error signal that is transmitted to a filter 606. The filter 606 is a low pass filter that removes high frequency disturbances in the error signal. In other words, short term error is ignored to avoid thrashing the VCO clock output. The filter 606 is clocked by a version of the VCO clock output that is generated by a second divider (FDIV) 603. Thus, the filter 606 operates at a slower frequency than the VCO clock output such that the value of the error is changed over a larger timespan than every clock cycle. The filtered error signal is transmitted to a sigma delta ($\Sigma\Delta$) unit 607 that accumulates the filtered error signal and adjusts the digital input code for the DAC 650. The $\Sigma\Delta$ unit 607 is clocked by a version of the VCO clock output that is generated by a third divider (MDIV) 604. Thus, the $\Sigma\Delta$ unit 607 operates at a slower frequency than the VCO clock output such that the accumulated error is changed over a larger timespan than every clock cycle and independently of the frequency of the filter 606.

As shown in FIG. 6, the differential output of DAC 650 in PLL 600 may be coupled to an Op Amp and NMOS transistor to implement the continuous-time deglitching technique described above. The non-inverting output of the DAC 650 may then be connected to the input of the VCO 660. In this manner, the PLL 600 is more stable than conventional PLLs due to the absence of large glitch energy being discharged over the non-inverting output of the DAC 650. It will be appreciated that the configuration of PLL 600 is shown for illustrative purposes and that alternative configurations of PLL 600 are within the scope of the present disclosure. In addition, the use of DACs is not limited to PLLs within a processor and other types of applications requiring DACs may be implemented with the continuous-time deglitching technique described above.

Figure 7:
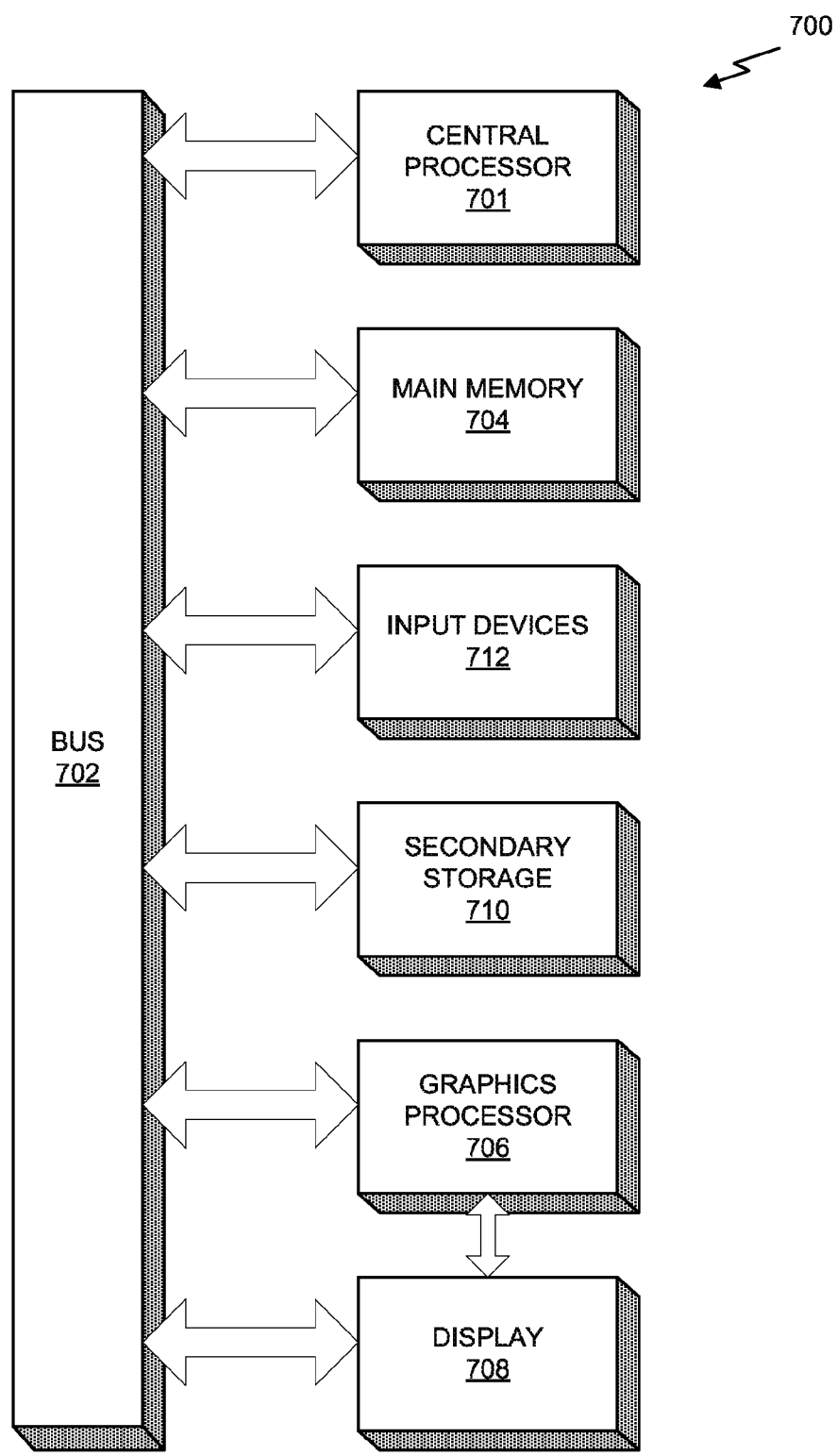
FIG. 7 illustrates an exemplary system in which the various architecture and/or functionality of the various previous embodiments may be implemented.

FIG. 7 illustrates an exemplary system 700 in which the various architecture and/or functionality of the various previous embodiments may be implemented. As shown, a system 700 is provided including at least one central processor 701 that is connected to a communication bus 702. The communication bus 702 may be implemented using any suitable protocol, such as PCI (Peripheral Component Interconnect), PCI-Express, AGP (Accelerated Graphics Port), HyperTransport, or any other bus or point-to-point communication protocol(s). The system 700 also includes a main memory 704. Control logic (software) and data are stored in the main memory 704 which may take the form of random access memory (RAM).

The system 700 also includes input devices 712, a graphics processor 706, and a display 708, i.e. a conventional CRT (cathode ray tube), LCD (liquid crystal display), LED (light emitting diode), plasma display or the like. User input may be received from the input devices 712, e.g., keyboard, mouse, touchpad, microphone, and the like. In one embodiment, the graphics processor 706 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 700 may also include a secondary storage 710. The secondary storage 710 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 704 and/or the secondary storage 710. Such computer programs, when executed, enable the system 700 to perform various functions. The memory 704, the storage 710, and/or any other storage are possible examples of computer-readable media.

In one embodiment, the architecture and/or functionality of the various previous figures may be implemented in the context of the central processor 701, the graphics processor 706, an integrated circuit (not shown) that is capable of at least a portion of the capabilities of both the central processor 701 and the graphics processor 706, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 700 may take the form of a desktop computer, laptop computer, server, workstation, game consoles, embedded system, and/or any other type of logic. Still yet, the system 700 may take the form of various other devices including, but not limited to a personal digital assistant (PDA) device, a mobile phone device, a television, etc.

Further, while not shown, the system 700 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A circuit, comprising:
   a digital-to-analog converter (DAC) having a differential output;
   an operational amplifier having an inverting input coupled to a first output of the differential output and a non-inverting input coupled to a second output of the differential output; and
   a transistor coupled to the second output and the output of the operational amplifier,
   wherein the operational amplifier is configured to operate the transistor to adjust the voltage potential of the second output to substantially match the voltage potential of the first output, and the circuit is included in a digital phase-locked loop (PLL) unit.

2. The circuit of claim 1, wherein the first output is a non-inverting output of the DAC and the second output is an inverting output of the DAC.

3. A circuit, comprising:
   a digital-to-analog converter (DAC) having a differential output;
   an operational amplifier having an inverting input coupled to a first output of the differential output and a non-inverting input coupled to a second output of the differential output, wherein the first output is a non-inverting output of the DAC and the second output is an inverting output of the DAC; and
   a transistor coupled to the second output and the output of the operational amplifier,
   wherein the operational amplifier is configured to operate the transistor to adjust the voltage potential of the second output to substantially match the voltage potential of the first output and, the transistor is an NMOS (n-type Metal Oxide Semiconductor) transistor having a drain coupled to the second output, and a source coupled to a ground potential.

4. The circuit of claim 1, wherein the DAC is configured to receive an N-bit digital input signal and generate the first output and the second output based on the N-bit digital input signal.

5. A circuit, comprising:
   a digital-to-analog converter (DAC) having a differential output, wherein the DAC is configured to receive an N-bit digital input signal and generate a first output of the differential output and a second output of the differential output based on the N-bit digital input signal;
   an operational amplifier having an inverting input coupled to the first output and a non-inverting input coupled to the second output; and
   a transistor coupled to the second output and the output of the operational amplifier, wherein the operational amplifier is configured to operate the transistor to adjust the voltage potential of the second output to substantially match the voltage potential of the first output, and a current supplied to the first output is proportional to the N-bit digital input signal, and a current supplied to the second output is proportional to an inverted version of the N-bit digital input signal.

6. The circuit of claim 1, further comprising an N-bit latch coupled to the input of the DAC.

7. A circuit, comprising:
   a digital-to-analog converter (DAC) having a differential output, wherein the DAC comprises a number of unit cells, and wherein each unit cell includes a current source and at least two switching elements that are configured to couple the current source to one of a first output of the differential output or a second output of the differential output;
   an operational amplifier having an inverting input coupled to the first output and a non-inverting input coupled to the second output; and
   a transistor coupled to the second output and the output of the operational amplifier,
   wherein the operational amplifier is configured to operate the transistor to adjust the voltage potential of the second output to substantially match the voltage potential of the first output.

8. The circuit of claim 7, wherein the at least two switching elements comprise a first PMOS transistor having a gate coupled to an input signal, $D_i$, and a drain coupled to the first output and a second PMOS transistor having a gate coupled to an inverted data signal, $\overline{D_i}$, and a drain coupled to the second output.

9. The circuit of claim 7, wherein the at least two switching elements comprise a first NMOS transistor having a gate coupled to an input signal, $D_i$, and a drain coupled to the first output and a second NMOS transistor having a gate coupled to an inverted data signal, $\overline{D_i}$, and a drain coupled to the second output.

10. The circuit of claim 7, wherein the current source comprises a transistor having a gate coupled to a bias voltage.

11. A processor, comprising:
    a digital phase-locked loop (PLL) unit that includes:
    a digital-to-analog converter (DAC) having a differential current output,
    an operational amplifier having an inverting input coupled to a first output of the differential current output and a non-inverting input coupled to a second output of the differential current output, and
    a transistor coupled to the second output and the output of the operational amplifier,
    wherein the operational amplifier is configured to operate the transistor to adjust the voltage potential of the second output to substantially match the voltage potential of the first output.

12. The processor of claim 11, wherein the first output is a non-inverting output of the DAC and the second output is an inverting output of the DAC.

13. A processor, comprising:
    a circuit that includes:
    a digital-to-analog converter (DAC) having a differential output,
    an operational amplifier having an inverting input coupled to a first output of the differential output and a non-inverting input coupled to a second output of the differential output, wherein the first output is a non-inverting output of the DAC and the second output is an inverting output of the DAC, and
    a transistor coupled to the second output and the output of the operational amplifier,
    wherein the operational amplifier is configured to operate the transistor to adjust the voltage potential of the second output to substantially match the voltage potential of the first output, and the transistor is an NMOS (n-type Metal Oxide Semiconductor) transistor having a drain coupled to the second output, and a source coupled to a ground potential.

14. The processor of claim 11, further comprising an N-bit latch coupled to the input of the DAC.

15. A processor, comprising:
a circuit that includes:
- a digital-to-analog converter (DAC) having a differential output, wherein the DAC comprises a number of unit cells, and wherein each unit cell includes a current source and at least two switching elements that are configured to couple the current source to one of a first output of the differential output or a second output of the differential output;
- an operational amplifier having an inverting input coupled to the first output and a non-inverting input coupled to the second output, and
- a transistor coupled to the second output and the output of the operational amplifier,
- wherein the operational amplifier is configured to operate the transistor to adjust the voltage potential of the second output to substantially match the voltage potential of the first output.

16. The processor of claim 15, wherein the at least two switching elements comprise a first PMOS transistor having a gate coupled to an input signal, $D_i$, and a drain coupled to the first output and a second PMOS transistor having a gate coupled to an inverted data signal, $\overline{D_i}$, and a drain coupled to the second output.

17. The processor of claim 15, wherein the at least two switching elements comprise a first NMOS transistor having a gate coupled to an input signal, $D_i$, and a drain coupled to the first output and a second NMOS transistor having a gate coupled to an inverted data signal, $\overline{D_i}$, and a drain coupled to the second output.

18. A processor, comprising:
a graphics processing unit that includes:
- a digital-to-analog converter (DAC) having a differential output,
- an operational amplifier having an inverting input coupled to a first output of the differential output and a non-inverting input coupled to a second output of the differential output, wherein the first output is a non-inverting output of the DAC and the second output is an inverting output of the DAC, and
- a transistor coupled to the second output and the output of the operational amplifier,
- wherein the operational amplifier is configured to operate the transistor to adjust the voltage potential of the second output to substantially match the voltage potential of the first output.

19. A processor, comprising:
a system-on-chip (SoC) that includes:
- a digital-to-analog converter (DAC) having a differential output,
- an operational amplifier having an inverting input coupled to a first output of the differential output and a non-inverting input coupled to a second output of the differential output, wherein the first output is a non-inverting output of the DAC and the second output is an inverting output of the DAC, and
- a transistor coupled to the second output and the output of the operational amplifier,
- wherein the operational amplifier is configured to operate the transistor to adjust the voltage potential of the second output to substantially match the voltage potential of the first output.

20. The processor of claim 11, wherein the DAC is configured to receive an N-bit digital input signal and generate the first output and the second output based on the N-bit digital input signal.

* * * * *